(12) United States Patent
Xia et al.

(10) Patent No.: US 10,514,406 B2
(45) Date of Patent: Dec. 24, 2019

(54) HIGH RESISTIVITY MATERIAL-BASED PACKAGING ELEMENT FOR ELECTRIC FIELD SENSOR (71) Applicant: Institute of Electronics, Chinese Academy of Sciences, Beijing (CN)

(72) Inventors: Shanhong Xia, Beijing (CN); Xiaolong Wen, Beijing (CN); Xianxiang Chen, Beijing (CN); Chunrong Peng, Beijing (CN); Pengfei Yang, Beijing (CN)

(73) Assignee: Institute of Electronics, Chinese Academy of Sciences, Beijing (CN)

( * ) Notice: Subject to any disclaimer, the term of this patent is extended or adjusted under 35 U.S.C. 154(b) by 190 days.

(21) Appl. No.: 14/787,851

(22) PCT Filed: Aug. 5, 2014

(86) PCT No.: PCT/CN2014/083691
§ 371 (c)(1),
(2) Date: Oct. 29, 2015

(87) PCT Pub. No.: WO2015/018310
PCT Pub. Date: Feb. 12, 2015

(65) Prior Publication Data
US 2016/0091546 A1 Mar. 31, 2016

(30) Foreign Application Priority Data
Aug. 7, 2013 (CN) .......................... 2013 1 0340888

(51) Int. Cl.
G01R 29/12 (2006.01)
G01R 29/08 (2006.01)
(Continued)

(52) U.S. Cl.
CPC ......... *G01R 29/12* (2013.01); *G01R 29/0878* (2013.01); *H05K 1/185* (2013.01); *H01L 23/053* (2013.01); *H01L 2224/48091* (2013.01)

(58) Field of Classification Search
CPC ............... G01R 29/12; G01R 29/0878; G01R 29/0835; G01R 29/105; G01R 31/001;
(Continued)

(56) References Cited

U.S. PATENT DOCUMENTS

| 5,547,777 | A * | 8/1996 | Richards ............... H01M 8/241 429/210 |
| 6,781,231 | B2 * | 8/2004 | Minervini ............ B81B 7/0064 257/704 |
| 9,182,454 | B1 * | 11/2015 | Williams ................ H01J 23/09 |
| 2008/0229840 | A1 * | 9/2008 | Shirasaka .............. H04R 19/00 73/754 |

(Continued)

FOREIGN PATENT DOCUMENTS

| CN | 1369905 | * | 9/2002 |
| CN | 1369905 A | | 9/2002 |

(Continued)

OTHER PUBLICATIONS

International Search Report for corresponding International Patent Application No. PCT/CN2014/083691 dated Nov. 15, 2014.

*Primary Examiner* — Thang X Le
(74) *Attorney, Agent, or Firm* — Merchant & Gould P.C.

(57) ABSTRACT

A high resistivity material-based packaging element for an electric field sensor comprises: a substrate; a first packaging frame fixed to the substrate; and a first packaging cover fixed to the packaging frame; wherein at least one electric field sensor chip is located in an inner cavity formed by the substrate, the first packaging frame, and the first packaging cover, and at least one of the substrate, the first packaging frame, and the first packaging cover is of a high resistivity material having an electrical resistivity equal to or greater than $10^8 \Omega \cdot cm$. The present invention can ensure accurate measurement of the electric field, and provide an approach (Continued)

to solve the problem of environmental adaptability, thereby enhancing the stability and reliability of electric field detection.

15 Claims, 4 Drawing Sheets

(51) Int. Cl.
*H05K 1/18* (2006.01)
*H01L 23/053* (2006.01)

(58) Field of Classification Search
CPC .............. G01R 31/002; G01R 31/2886; G01R 31/2856; G01R 31/286; G01R 1/18; G01R 1/07342; G01R 1/06711; G01R 1/04; G01R 1/0416; G01R 1/0483; H05K 1/185; H01L 23/053; H01L 2224/48091; H01L 2924/00014
See application file for complete search history.

(56) References Cited

U.S. PATENT DOCUMENTS

| | | | | |
|---|---|---|---|---|
| 2011/0241648 | A1* | 10/2011 | Berkcan | G01R 29/0878 |
| | | | | 324/72 |
| 2012/0273908 | A1* | 11/2012 | Kinsman | H01L 27/14618 |
| | | | | 257/432 |
| 2013/0306868 | A1* | 11/2013 | Yamazaki | G01J 5/045 |
| | | | | 250/338.1 |
| 2014/0007682 | A1* | 1/2014 | Kabasawa | G01C 19/56 |
| | | | | 73/504.12 |
| 2014/0218019 | A1* | 8/2014 | Ausserlechner | G01R 15/20 |
| | | | | 324/251 |
| 2014/0331777 | A1* | 11/2014 | Tomita | G01L 9/06 |
| | | | | 73/754 |

FOREIGN PATENT DOCUMENTS

| | | |
|---|---|---|
| CN | 1638070 A | 7/2005 |
| CN | 101337652 A | 1/2009 |
| CN | 101683966 A | 3/2010 |
| CN | 103633036 A | 3/2014 |
| JP | 08-003501 B2 | 1/1996 |

\* cited by examiner

HIGH RESISTIVITY MATERIAL-BASED PACKAGING ELEMENT FOR ELECTRIC FIELD SENSOR

This application is a National Stage Application of PCT/CN2014/083691, filed 5 Aug. 2014, which claims benefit of Serial No. 201310340888.9, filed 7 Aug. 2013 in China and which applications are incorporated herein by reference. A claim of priority is made to each of the above disclosed applications.

TECHNICAL FIELD

The present disclosure relates to the field of electric field detection technology, and more particularly, to a high resistivity material-based packaging element for an electric field sensor.

BACKGROUND

The electric field monitoring is of great significance. According to the characteristic laws of the change in atmospheric electric field, intensity of the electric field in a space region or around equipment is monitored by an electric field sensor, which has very important applications in such fields as aerospace, national defense, smart power grids, weather, and industrial production or the like. With the monitoring of the change in the atmospheric static electric field close to the ground and in the air by the electric field sensor, accurate weather information can be obtained, so as to provide important security assurance to launch of aircrafts such as guided missiles and satellites or the like, or provide lightning early warning, forest fire prevention, earthquake prediction or the like.

With the rapid development of micro/nano machining technology and integration technology, the development of a new type of electric field sensor with a small size, low power consumption, and easy mass production becomes an interesting research direction in the field of electric field detection technology. Due to the outstanding advantages such as a low cost, a small size, low power consumption, feasible mass production, easy integration, a wide operating frequency band, and a high spatial resolution for electric field detection, the micro/nano technology based micro electric field sensor gradually becomes one of devices for electric field detection having important development potentials, and gets more and more attention from researchers in the world.

However, in practical applications, micro electric field sensor sensitive chips are susceptible to the influence of the dust air, airflow, rain and snow, and high humidity or the like and thus cannot operate properly. Therefore, packaging is an important challenge for practical applications of a micro electric field sensor. The micro electric field sensor is easily affected by external environment factors due to its small size and weak signal. There are many ways for packaging micro sensors, for example packaging schemes such as using a pure metal sealing cap, arranging a hole in an upper surface of a metal cover or the like. However, in the former case, the electric field is shielded due to a metal cabin formed by metal and a substrate, and in the latter case, it is difficult to achieve effective packaging due to failing to block humidity, dust or the like from entering the metal cabin.

SUMMARY

The present disclosure aims to provide a high resistivity material-based packaging element for an electric field sensor.

According to the present disclosure, a high resistivity material-based packaging element for an electric field sensor comprises:
a first packaging frame fixed to the substrate; and
a first packaging cover fixed to the packaging frame;
wherein,
at least one electric field sensor chip is located in an inner cavity formed by the substrate, the first packaging frame, and the first packaging cover, and
at least one of the substrate, the first packaging frame, and the first packaging cover is of a high resistivity material having an electrical resistivity equal to or greater than $10^8 \Omega \cdot cm$.

The present disclosure can ensure accurate measurement of the electric field, and provide an important approach to solve the key problem of environmental adaptability, thereby enhancing the stability and reliability of the electric field detection.

DETAILED DESCRIPTION

In order to make the purpose, technical solutions, and advantages of the present disclosure more clear and obvious, the present disclosure will be further described in detail below in conjunction with specific embodiments and with reference to drawings. It should be illustrated that in the drawings or the description of the specification, the same reference numbers are used for similar or identical parts. Implementations which are not illustrated or described in the drawings are well-known forms for those skilled in the art. In addition, although examples of parameters including specific values may be provided herein, it should be understood that the parameters may not exactly equal to the corresponding values, and may be approximate to the corresponding values within an allowable error tolerance or design constraint. Further, directional expressions such as "up', "down", "front", "back", "left", "right" or the like which are mentioned in the following embodiments are merely directions with reference to the drawings. Therefore, the directional expressions are used to describe the present disclosure without limitation.

The present disclosure provides a packaging element for an electric field sensor. In the packaging element for an electric field sensor, at least one of a substrate, a packaging frame, and a packaging cover is made of a high resistivity material, so as to achieve stable, accurate, and reliable electric field detection, and satisfy requirements for practical applications.

Figure 1A:
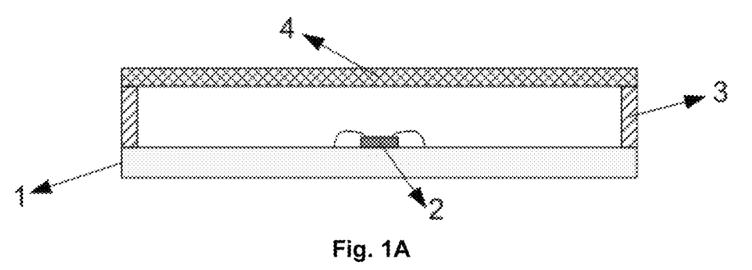
FIG. 1A is a sectional diagram of a high resistivity material-based packaging element for an electric field sensor according to a first embodiment of the present disclosure.

In a first exemplary embodiment of the present disclosure, a packaging element for an electric field sensor is provided. As shown in FIG. 1A, the packaging element for an electric field sensor comprises a substrate 1; an electric field sensor chip 2, fixed on the substrate; a packaging frame 3 fixed on the substrate 1, wherein the electric field sensor chip has an enclosed frame structure of the surrounding thereof, and has a predetermined thickness; and a packaging cover fixed on the packaging frame 3, wherein the substrate 1, the packaging frame 3 and the packaging cover 4 form an inner cavity to accommodate the electric field sensor chip 2. At least one of the substrate 1, the packaging frame 3, and the packaging cover 4 is made of a high resistivity material. In the present disclosure, the high-sensitivity material is a material having an electrical resistivity equal to or larger than $10^8 \Omega \cdot cm$, which may be any one or more of ceramic, sapphire, organic macromolecule polymer, silicon dioxide or other high-sensitivity materials.

Various constituent elements of the packaging element for an electric field sensor according to the present embodiment will be described in detail below respectively.

The substrate 1 may be any of a metal substrate, a ceramic substrate, a polymer substrate, or other substrates. The substrate 1 should include a metal soldering pad and a signal path thereon for electrical interactive connection to the sensor chip 2. According to different types of substrates, the substrate may include elements such as a pin, a soldering pad, a chip slot, a via hole, a connector or the like thereon.

The sensor chip 2 is fixed to the center of the substrate 1, and is wire-bounded to a metal soldering lug of the substrate 1. The sensor chip 2 may be fixed in any of a double-sided tape adhesive bonding manner, a solder bonding manner or other chip fixing manners. The wire bonding manner comprises any of a gold ball bonding manner, a silicon aluminum wire welding manner, or other wire bonding manners.

The sensor chip 2 is an electrostatic field sensor chip or an alternating electric field sensor chip, and comprises a micromechanic structure chip, a microelectronic sensitive chip, an optical sensitive chip, or other types of sensitive chips.

Figure 1B:
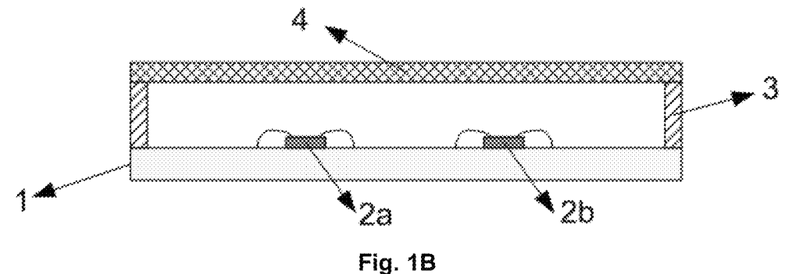
FIG. 1B is a sectional diagram of a first variation of the high resistivity material-based packaging element for an electric field sensor illustrated in FIG. 1A.

In the embodiment illustrated in FIG. 1A, there is merely one sensor chip in the inner cavity formed by the substrate 1, the packaging frame 3, and the packaging cover. However, those skilled in the art should understand that there may also be two or more sensor chips located in the above inner cavity. As shown in FIG. 1B, in the inner cavity formed by the substrate 1, the packaging frame 3, and the packaging cover 4, two sensor chips 2a and 2b are fixed on the same side of the substrate 1, and are bounded to corresponding wires respectively.

The packaging frame 3 is fixed on the substrate 1, is in an annulus shape, and has a certain height, so as to leave enough space in the inner cavity of the packaging frame 3 to accommodate the sensor chip 2. Those skilled in the art should understand that in addition to the annulus packaging frame 3 illustrated in FIG. 1, the packaging frame 3 may also be in a square shape, or another irregular shape, which has the same function as that of the above annulus packaging frame 3, and will not be described here in detail.

Figure 1C:
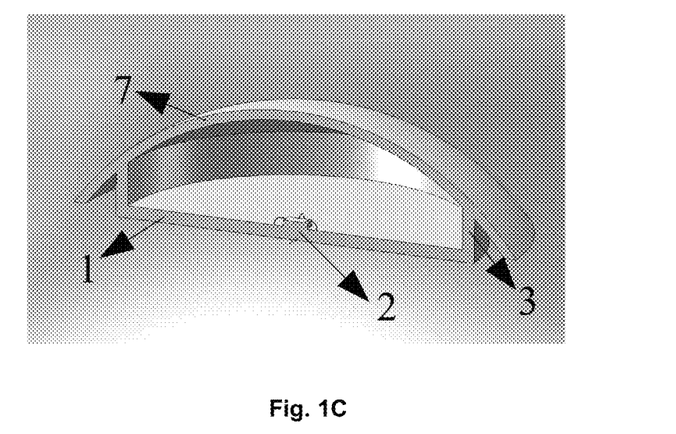
FIG. 1C is a stereogram of a second variation of the high resistivity material-based packaging element for an electric field sensor illustrated in FIG. 1A.

The packaging cover 4 is permanently fixed to the packaging frame 3, and may be in any of a circular shape, a square shape, or another irregular shape which is parallel to the substrate 1. After the substrate 1, the packaging frame 3 and the packaging cover 4 are connected, an enclosed inner cavity for accommodating and protecting the sensor chip 2 is formed therein. The packaging cover 4 may be in any of a planar circular shape, a planar square shape, or another planar irregular shape, for example, a hemispherical shape having an opening oriented to the substrate 1, as shown in FIG. 1C. The packaging cover 7 in a hemispherical shape can reduce accumulation of contaminants and maintain sensitivity of the electric field sensor.

The packaging frame 3, the substrate 1 and the packaging cover 4 are connected in any of an adhesive bonding manner, a solder bonding manner, a welding manner, a screw spinning manner, a mechanical pressure welding manner, an electroplating manner, or another joint connection manner. In a case of the adhesive bonding manner, an adhesive bonded surface may be polished and pretreated. In a case of the solder bonding manner, a bonded surface may be burnished, metalized, and pretreated. In a case of the screw spinning manner, there is a need to manufacture a matched screw at the connection, and protrusions or grooves are added at the connection to extend the length of the solenoid when necessary. In a case of the mechanical pressure welding manner, glue may be pasted or a glue cushion may be padded at the pressure welded connection, to improve the sealing for pressure welding, and a screw may also be fixed to increase the pressure welding force.

Figure 1D:
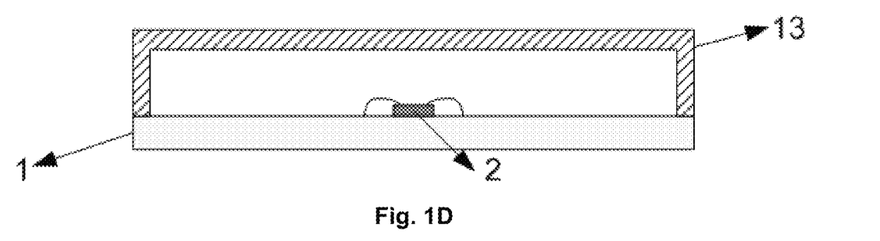
FIG. 1D is a sectional diagram of a third variation of the high resistivity material-based packaging element for an electric field sensor illustrated in FIG. 1A.

In addition, the packaging frame 3 and the packaging cover 4 may also be a concave cavity structure which is integrally manufactured. Therefore, the packaging frame 3 and the packaging cover 4 are made of the same high-sensitivity material or metal material. When the integrated structure 13 is of a metal material, the substrate 1 is of a high resistivity material. In this case, the packaging frame 3 and the packaging cover 4 are not necessarily connected, as shown in FIG. 1D.

In the present embodiment, a combination of the materials corresponding to the packaging frame 3 and the packaging cover 4 is a high resistivity material-a metal material, a high resistivity material-a high resistivity material, or a metal material-a high resistivity material, so as to ensure accurate measurement of the electric field, and provide an important approach to solve the key problem of environmental adaptability, thereby enhancing the stability and reliability of the electric field detection. In addition, after the chip is loaded, a lamination combination and a nesting manner among the substrate, the packaging frame and the packaging cover achieve joint connection, so as to achieve the purpose of protecting the sensor and improving the environmental adaptability.

At this point, the packaging element for an electric field sensor according to the present embodiment is completely described.

Figure 2A:
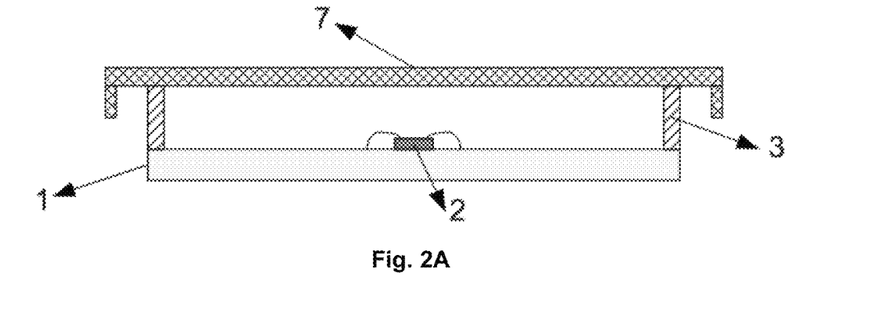
FIG. 2A is a sectional diagram of a high resistivity material-based packaging element for an electric field sensor according to a second embodiment of the present disclosure.
Figure 2B:
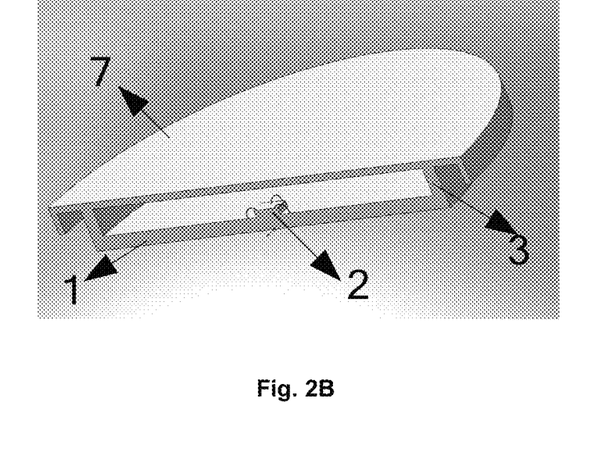
FIG. 2B is a stereogram of a high resistivity material-based packaging element for an electric field sensor according to a second embodiment of the present disclosure.

In a second exemplary embodiment of the present disclosure, another packaging element for an electric field sensor is further provided. As shown in FIGS. 2A and 2B, a structure of the packaging element for an electric field sensor according to the present embodiment is substantially similar to that of the packaging element for an electric field sensor illustrated in FIG. 1A, merely except that the packaging cover 7 outwardly extends for a certain distance in a direction parallel to the substrate 1, and is then bent towards the substrate, and a combination of materials corresponding to the packaging frame 3 and the packaging cover 7 is a high resistivity material-a metal material, a high resistivity material-a high resistivity material, or a metal material-a high resistivity material.

Figure 3:
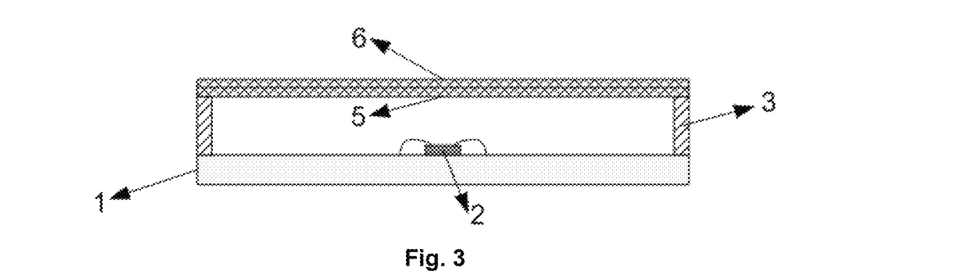
FIG. 3 is a sectional diagram of a high resistivity material-based packaging element for an electric field sensor according to a third embodiment of the present disclosure.

In a third exemplary embodiment of the present disclosure, another packaging element for an electric field sensor is further provided. As shown in FIG. 3, a structure of the packaging element for an electric field sensor according to the present embodiment is substantially similar to that of the packaging element for an electric field sensor illustrated in FIG. 1, merely except that the packaging cover may also be formed by two materials. As shown in FIG. 1C, the packaging cover is formed by an upper layer 6 of the packaging cover and a lower layer 5 of the packaging cover, wherein the two layers are jointly connected, and the lower layer 5 of the packaging cover is directly in contact with the packaging frame 3.

A combination of materials corresponding to the packaging frame 3, the lower layer 5 of the packaging cover, and the upper layer 6 of the packaging cover is a high resistivity material-a high resistivity material-a high resistivity material, a high resistivity material-a high resistivity material-a metal material, a high resistivity material-a metal material-a high resistivity material, a high resistivity material-a metal material-a metal material, a metal material-a high resistivity material-a high resistivity material, or a metal material-a high resistivity material-a metal material.

Figure 4:
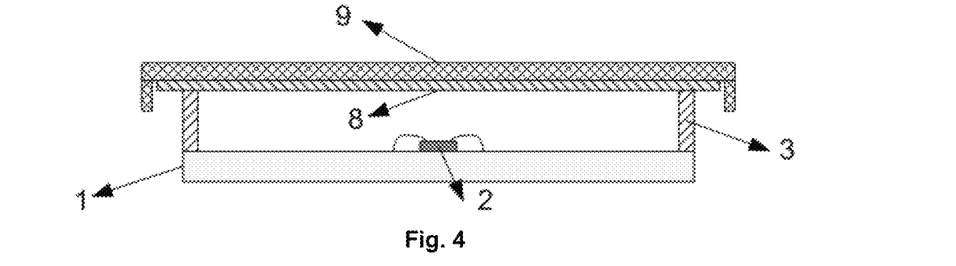
FIG. 4 is a sectional diagram of a high resistivity material-based packaging element for an electric field sensor according to a fourth embodiment of the present disclosure.

In a fourth exemplary embodiment of the present disclosure, another packaging element for an electric field sensor is further provided. As shown in FIG. 4, a structure of the packaging element for an electric field sensor according to the present embodiment is substantially similar to that of the packaging element for an electric field sensor illustrated in FIGS. 2A and 2B, merely except that the packaging cover is formed by an upper layer 9 of the packaging cover and a lower layer 8 of the packaging cover, and the two layers are jointly connected. The lower layer 8 of the packaging cover is a planar circular or square shape, and is directly in contact with the packaging frame 3. The upper layer 9 of the packaging cover outwardly extends for a certain distance in a direction parallel to the substrate 1, and is then bent towards the substrate. The lower layer 8 of the packaging cover outwardly extends for a certain distance in a direction parallel to the substrate 1 which is no more than the distance for which the upper layer 9 of the packaging cover extends. The upper layer 9 of the packaging cover and the lower layer 8 of the packaging cover may be in a planar shape, or may be in a hemispherical shape having an opening oriented to the substrate. A combination of materials corresponding to the packaging frame 3, the lower layer 8 of the packaging cover, and the upper layer 9 of the packaging cover is a high resistivity material-a high resistivity material-a high resistivity material, a high resistivity material-a high resistivity material-a metal material, a high resistivity material-a metal material-a high resistivity material, a high resistivity material-a metal material-a metal material, a metal material-a high resistivity material-a high resistivity material, or a metal material-a high resistivity material-a metal material.

Figure 5:
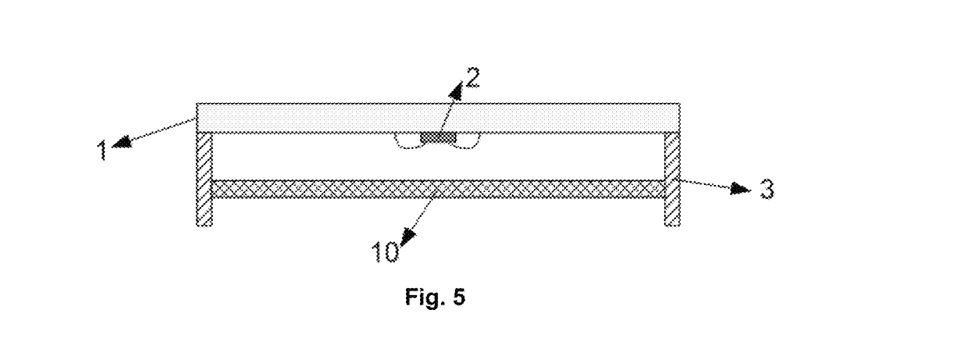
FIG. 5 is a sectional diagram of a high resistivity material-based packaging element for an electric field sensor according to a fifth embodiment of the present disclosure.

In a fifth exemplary embodiment of the present disclosure, another packaging element for an electric field sensor is further provided. As shown in FIG. 5, a structure of the packaging element for an electric field sensor according to the present embodiment is substantially similar to that of the packaging element for an electric field sensor illustrated in FIG. 1, merely except that the packaging frame 3 outwardly extends for a certain distance in a direction perpendicular to the substrate 1, and the packaging cover 10 is fixed to a middle segment of the packaging frame. A combination of materials corresponding to the packaging frame 3 and the packaging cover 10 is a high resistivity material-a metal material, a high resistivity material-a high resistivity material, or a metal material-a high resistivity material.

Figure 6:
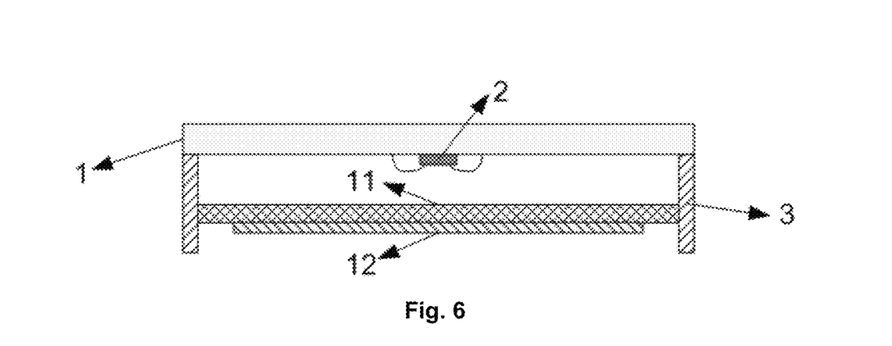
FIG. 6 is a sectional diagram of a high resistivity material-based packaging element for an electric field sensor according to a sixth embodiment of the present disclosure.

In a sixth exemplary embodiment of the present disclosure, another packaging element for an electric field sensor is further provided. As shown in FIG. 6, a structure of the packaging element for an electric field sensor according to the present embodiment is substantially similar to that of the packaging element for an electric field sensor illustrated in FIG. 5, merely except that the packaging cover is comprised of an upper layer 12 of the packaging cover and a lower layer 11 of the packaging cover, and the two layers are jointly connected.

The packaging frame 3 extends outwardly for a certain distance in a direction perpendicular to the substrate 1, and the upper layer 12 of the packaging cover is reduced inwardly by a distance in a direction parallel to the substrate 1. A combination of materials corresponding to the packaging frame 3, the lower layer 11 of the packaging cover, and the upper layer 12 of the packaging cover is a high resistivity material-a high resistivity material-a high resistivity material, a high resistivity material-a high resistivity material-a metal material, a high resistivity material-a metal material-a high resistivity material, a high resistivity material-a metal material-a metal material, a metal material-a high resistivity material-a high resistivity material, or a metal material-a high resistivity material-a metal material.

Figure 7:
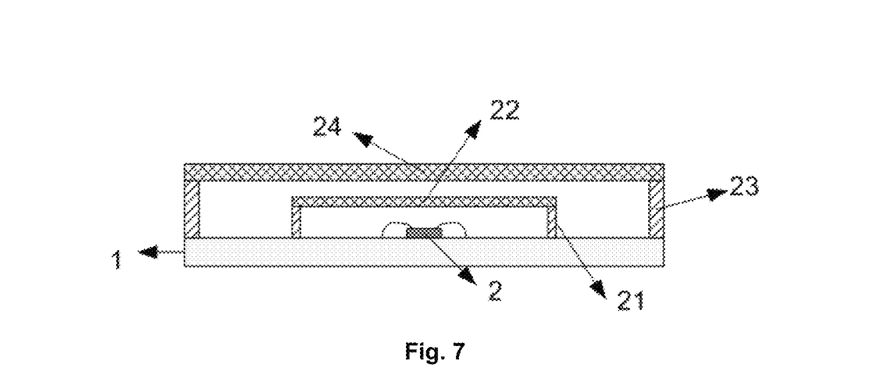
FIG. 7 is a sectional diagram of a high resistivity material-based packaging element for an electric field sensor according to a seventh embodiment of the present disclosure.

In a seventh exemplary embodiment of the present disclosure, another packaging element for an electric field sensor is further provided. As shown in FIG. 7, the sensor chip 2 is fixed on the substrate 1 and is bonded to a wire. In the present embodiment, a packaging structure in which an inner layer and an outer layer are separated for a predetermined distance is included. In order to be distinguished from the embodiment illustrated in FIG. 1, the packaging frame 21 is referred to a second packaging frame, and the packaging cover 22 is referred to as a second packaging cover. Material and structure schemes of two-layer packaging including substrate 1-packaging frame 21-packaging cover 22 and substrate 1-packaging frame 23-packaging cover 24 may be used in any of FIGS. 1-4. A packaging element formed by the subtrate 1-packaging frame 21-packaging cover 22 is located in a packaging element formed by the substrate 1-packaging frame 23-packaging cover 24.

The above first to seventh embodiments describe a high resistivity material based packaging element for an electric field sensor comprising a single substrate, a sensor chip, a packaging frame or a packaging cover. Based on the above description, those skilled in the art should clearly understand the packaging element for an electric field sensor according to the present disclosure.

At this point, the packaging assembly for an electric field sensor according to the present disclosure has been described in detail in conjunction with accompanying drawings. Based on the above description, those skilled in the art should clearly understand the packaging assembly for an electric field sensor according to the present disclosure.

In addition, the definition of the above various elements is not limited to various specific structures or shapes mentioned in the embodiments, and well-known substitutions can be simply made by those skilled in the art.

In conclusion, the present disclosure provides a packaging element and assembly for an electric field sensor, which comprises at least one sensor chip, a substrate, a packaging annulus, and a packaging cover. One or more of the substrate, the packaging annulus, or the packaging cover are made of a high resistivity material, and a lamination combination and a nesting manner among the substrate, the packaging annulus and the packaging cover achieve joint connection. As at least one of the packaging annulus or the packaging cover uses the high resistivity material, the present disclosure can ensure accurate measurement of the electric field, and provide an important approach to solve the key problem of environmental adaptability, thereby enhancing the stability and reliability of the electric field detection.

The specific embodiments described above are used to further describe the purpose, technical solutions and beneficial effects of the present disclosure in detail. It should be understood that the above description is merely specific embodiments of the present disclosure, instead of limiting the present disclosure. Any amendment, equivalent substitution, improvement or the like made within the spirit and principle of the present disclosure should be included in the protection scope of the present disclosure.

We claim:

1. A high resistivity material-based packaging element for an electric field sensor, comprising:
   a substrate;
   a first packaging frame fixed to the substrate; and
   a first packaging cover fixed to the packaging frame; wherein,
   at least one electric field sensor chip is located in an inner cavity formed by the substrate, the first packaging frame, and the first packaging cover, and
   the substrate, the first packaging frame, and the first packaging cover is of high resistivity material having an electrical resistivity equal to or greater than $10^8 \Omega \cdot cm$;
   wherein
   the first packaging cover is made of high resistivity material and the first packaging frame is made of a metal material; or
   the first packaging cover is made of the metal material and the first packaging frame is made of high resistivity material.

2. The packaging element according to claim 1, wherein the high resistivity material is selected from materials of ceramic, sapphire, organic macromolecule polymer, or silicon dioxide.

3. The packaging element according to claim 1, wherein the first packaging cover is in a circular or square shape and has a planar structure, or is in a circular or square shape and is bent for a predetermined distance towards the substrate, or is in a hemispherical shape and has an opening oriented to the substrate.

4. The packaging element according to claim 3, wherein the first packaging cover is in a hemispherical shape and has the opening oriented to the substrate, and the hemispherical packaging cover outwardly extends for a predetermined distance, so as to cover the packaging frame.

5. The packaging element according to claim 1, wherein the first packaging cover outwardly extends for a predetermined distance in a direction parallel to the substrate, or is bent towards the substrate.

6. The packaging element according to claim 1, wherein the first packaging cover is comprised of two materials corresponding to an upper layer and a lower layer.

7. The packaging element according to claim 6, wherein a combination of materials corresponding to the first packaging frame, the lower layer of the packaging cover, and the upper layer of the packaging cover comprises high resistivity material high resistivity material metal material, high resistivity material metal material high resistivity material, high resistivity material metal material metal material, metal material high resistivity material high resistivity material, or—a metal material high resistivity material —a metal material.

8. The packaging element according to claim 6, wherein the upper layer of the packaging cover outwardly extends for a predetermined distance in a direction parallel to the substrate and is bent towards the substrate, and the lower layer of the packaging cover outwardly extends for a predetermined distance in a direction parallel to the substrate which is no more than the distance for which the upper layer of the packaging cover extends.

9. The packaging element according to claim 1, wherein the first packaging frame outwardly extends for a distance in a direction perpendicular to the substrate, and the first packaging cover is fixed to a middle segment of the packaging frame.

10. The packaging element according to claim 9, wherein a combination of materials corresponding to the first packaging frame and the first packaging cover comprises high resistivity material metal material, or metal material high resistivity material.

11. The packaging element according to claim 9, wherein the first packaging cover is comprised of an upper layer of the packaging cover and a lower layer of the packaging cover; and
   the lower layer of the packaging cover is fixed to the middle segment of the packaging frame, and the upper layer of the packaging cover is reduced inwardly by a distance in a direction parallel to the substrate.

12. The packaging element according to claim 11, wherein a combination of materials corresponding to the packaging frame, the lower layer of the packaging cover, and the upper layer of the packaging cover comprises high resistivity material high resistivity material metal material, high resistivity material metal material high resistivity material, high resistivity material metal material metal material, metal material high resistivity material high resistivity material, or metal material high resistivity material metal material.

13. The packaging element according to claim 1, wherein the first packaging frame is in a circular shape or a square shape.

14. The packaging element according to claim 1, wherein there are two or more sensor chips.

15. The packaging element according to claim 1, further comprising:
   a second packaging frame fixed to the substrate; and
   a second packaging cover fixed to the second packaging frame; wherein
   a second packaging element formed by the substrate, the second packaging frame, and the second packaging cover is located in a first packaging element formed by the substrate, the first packaging frame, and the first packaging cover.

* * * * *